United States Patent

Paluck

[11] 3,935,476
[45] Jan. 27, 1976

[54] COMBINATION OUTPUT/INPUT LOGIC FOR INTEGRATED CIRCUIT

[75] Inventor: Robert John Paluck, Carrollton, Tex.

[73] Assignee: Mostek Corporation, Carrollton, Tex.

[22] Filed: Dec. 13, 1974

[21] Appl. No.: 532,406

[52] U.S. Cl. .............. 307/213; 307/205; 307/216; 307/303
[51] Int. Cl.² .................. H03K 19/08; H03K 19/32
[58] Field of Search .......... 307/205, 213, 216, 208, 307/303, 238

[56] References Cited
UNITED STATES PATENTS
3,573,756  4/1971  Hillis et al. ...................... 307/238 X
3,699,544  10/1972  Joynson et al. .................. 307/238 X Primary Examiner—John Zazworsky
Attorney, Agent, or Firm—Hubbard, Thurmann, Turner & Tucker

[57] ABSTRACT

Method and circuit for both outputting and inputting data by way of a single pin connector for an integrated circuit chip is disclosed. Data from the chip is fed through an output buffer on the chip and a standard pin connector to external circuitry. The input and the output of the output buffer are connected to separate logic inputs of a comparator such as an EXCLUSIVE OR gate. For data output, the external circuitry allows the output buffer to follow the input of the buffer, in which case the output of the EXCLUSIVE OR gate is a logic 0. However, when the external circuitry overrides the output of the output buffer causing the output to be different from the input to the buffer, the output of the EXCLUSIVE OR gate produces a logic 1 signal which indicates that data is being input and that the data at the pin connector is valid input data.

3 Claims, 4 Drawing Figures

COMBINATION OUTPUT/INPUT LOGIC FOR INTEGRATED CIRCUIT

This invention relates generally to integrated logic circuits, and more particularly relates to a circuit for both outputting data from and inputting data to an integrated circuit chip, particularly MOSFET integrated circuits, by way of a single connector pin.

The advent of large scale MOSFET integrated circuits has made hand held portable calculators and digital electronic clocks a reality. Similar circuits are also used for a wide variety of automated systems which employ random access memories, read only memories, and the like. Such circuits are commonly mounted in hermitically sealed packages which are commercially available from a number of suppliers in standard sizes having various standard numbers of pins in standard configurations. These standardized packages are significant in that standardized connector sockets are also readily available to the industry from a number of suppliers. In the production of such integrated circuits, the reduction of the number of connector pins required to provide the necessary power supply and data information to and from the integrated circuit is a significant factor.

The present invention is concerned with a method and the corresponding logic circuitry for both outputting and inputting logic data through one connector pin, thus reducing the number of pins required for a particular integrated logic circuit having a given number of functions. In particular, an output buffer is provided on the integrated circuit chip which has a logic input that receives logic output data from the internal circuit, and a logic output that is connected to a pin of the integrated circuit package. The input of the buffer is connected to one input of an EXCLUSIVE OR gate and the output of the buffer is connected to another input of the EXCLUSIVE OR gate. Circuitry external to the chip is provided to override the output of the buffer when data is to be input to the chip. This override condition is detected by the EXCLUSIVE OR gate to produce a data input enable signal which, together with the logic level existing at the pin, may be used internally of the circuit as desired.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figures 1, 2:
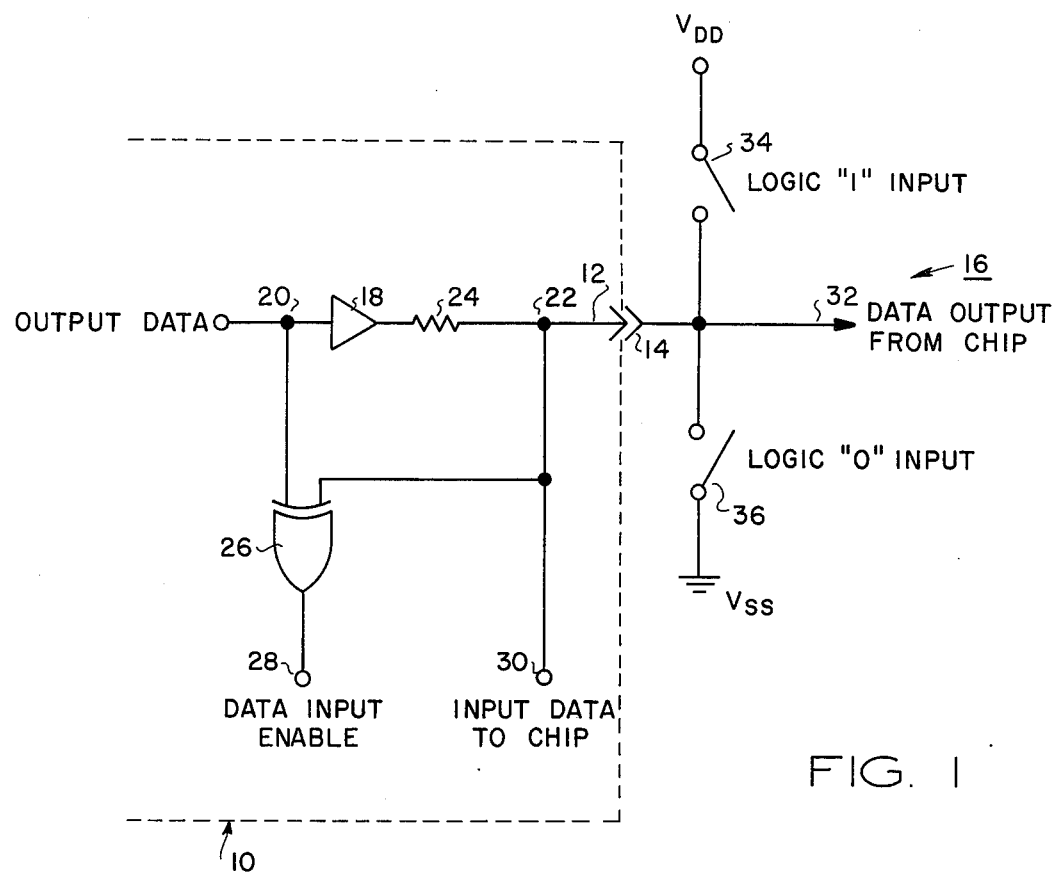
FIG. 1 is a simplified logic diagram of a system in accordance with the present invention.
FIG. 2 is a truth table for the circuit of FIG. 1.

Referring now to the drawings, and in particular to FIG. 1, an integrated circuit chip is indicated generally by the reference numeral 10. An electrical connector pin for the package of the circuit chip is indicated generally by the reference numeral 12 and is adapted to be plugged into a suitable receptacle 14 leading to an external logic circuit 16.

A non-inverting output buffer 18 has a logic input node 20 which is connected to receive Output Data from any conventional data processing circuitry on the chip 10, and a logic output node 22 which is connected directly to the pin 12. The output impedance of the buffer 18 is represented schematically by the resistor 24. As will hereafter be described in greater detail, the buffer 18 may be of the push-pull type, or may provide current from the drain supply voltage $V_{DD}$ to the external circuit, or may sink current to the source voltage supply $V_{SS}$ from the external circuit as desired. The output impedance 24 of the buffer 18 may vary widely as will presently be described.

The logic input 20 and the logic output 22 are connected to two inputs of an EXCLUSIVE OR gate 26. The logic output 28 of gate 26 provides a Data Input Enable Signal as will presently be described. Node 30 carries Input Data to the chip circuitry and is connected directly to the pin 12. Nodes 28 and 30 may be used individually or in logical combinations by the chip circuitry as will hereafter become evident to those skilled in the art.

The pin 12 is connected directly to a data output line 32 which may be used by external logic circuitry (not illustrated) in any suitable manner. In addition, suitable circuitry represented by switches 34 and 36 is provided to connect a voltage supply $V_{DD}$ to the pin 12 to provide a logic 1 input, or alternatively, to connect pin 12 to the voltage supply $V_{SS}$, for example, to provide a logic 0 input. It should be appreciated that $V_{SS}$ is the standard symbol for the substrate supply voltage and $V_{DD}$ the drain supply voltage, which may be either positive or negative with respect to $V_{SS}$, depending upon the type of MOSFETs used in the chip circuitry.

FIG. 2 is a truth table representing the logic level on node 28, which is designated as the Data Input Enable signal, as a function of the logic levels on nodes 20 and 22, which are the logic input and the logic output of the buffer 18, respectively. Consider first the data output period, which may be defined as that period during which neither switch 34 nor 36 is closed to input data to pin 12. In that case, nodes 20 and 22 are always the same, either logic 1 or logic 0, so that the output from EXCLUSIVE OR gate 26 is a logic 0 in each case.

A logic 0 may be input to the chip 10 whenever the Output Data node 20 is at a logic 1 level by closing switch 36 to override the normal logic 1 level on the output of buffer 18 and pulling node 22 to $V_{SS}$. In that case, the data input enable node 28 will be at a logic 1 level indicating that the logic level on Input Data node 30 is valid. Similarly, a logic 1 can be input to the chip whenever Output Data node 20 is at a logic 0 by closing switch 34 to override the output of buffer 18 and pull node 22 to $V_{DD}$. This also produces a logic 1 at Data Input Enable node 28 indicating that the logic 1 at Data Input node 30 is valid.

It will be appreciated by those skilled in the art that the logic circuit of FIG. 1 may be used in a variety of applications. For example, a logic 1 or a logic 0 input can be detected within the chip by sequentially switching output data node 20 to both a logic 1 and a logic 0 level and detecting a logic 1 output on node 28 during an input scan cycle. In such a case, the logic level of node 30 when node 28 goes to a logic 1 level indicates the valid data input. In such a case, the output impedance 24 of the buffer 18 must be sufficiently high to prevent damage to the chip 10.

Figure 3:
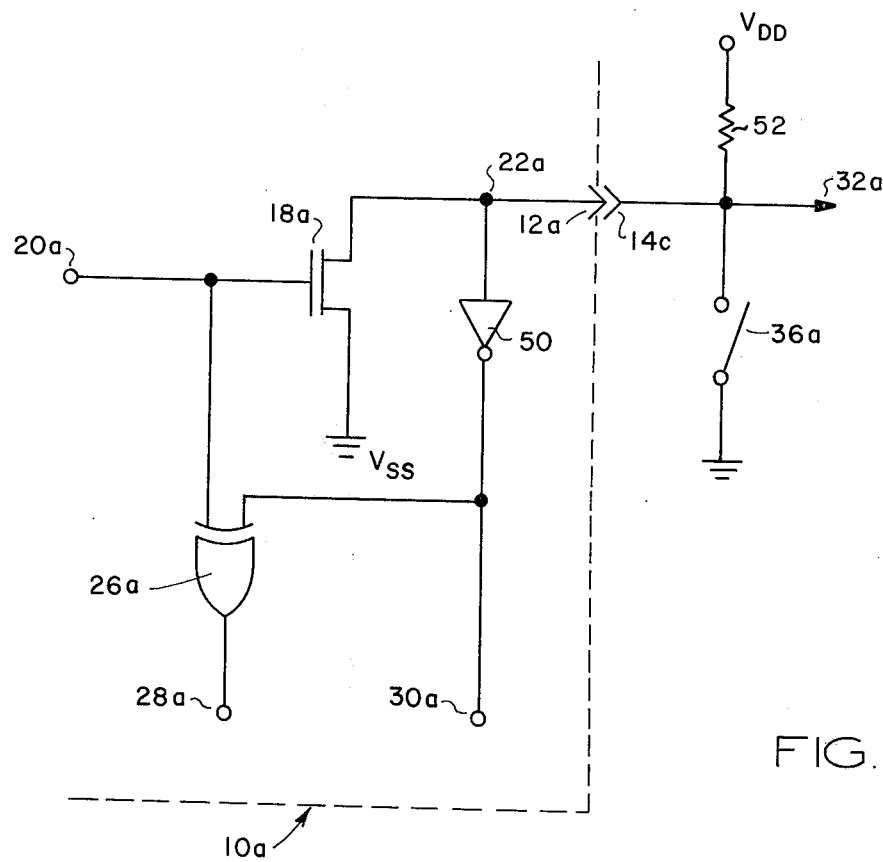
FIG. 3 is a simplified logic diagram illustrating another aspect of the present invention.

FIG. 3 illustrates a specific application of the general case illustrated in FIG. 1. Accordingly, the same reference numerals followed by the reference character A are used to represent corresponding components and nodes in FIG. 3. The circuit of FIG. 3 differs from that of FIG. 1 only in that the output buffer 18a is an inverting buffer, and an inverter 50 connects node 22a to node 30a and to one input of the EXCLUSIVE OR gate 26a. Additionally, a load resistor 52 replaces switch 34. The inverting buffer, of course, also changes the truth table of FIG. 2. Also, the EXCLUSIVE OR gate can be simplified in this special case, if desired.

In normal operation, switch 36a is open and a logic 1 level on node 20a turns transistor 18a on, thus pulling nodes 22a and 32a substantially to $V_{SS}$, the logic 0 level. Although node 22a is actually opposite from node 20a, inverter 50 compensates for the inversion produced by the buffer so that both inputs to the EXCLUSIVE OR gate 26a are the same, and a logic 0 level is produced at output node 28a.

When node 20a is at a logic 0 level, output buffer transistor 18a is turned off, and nodes 22a and 32a go to a voltage approaching $V_{DD}$ to represent a logic 1 level as a result of operation of the load resistor 52. Again, inverter 50 results in EXCLUSIVE OR gate 26a producing a logic 0 level.

However, when switch 36a is closed to input data to the integrated circuit, output 22a is held at the logic 0 level so that the output from inverter 50 is a logic 1. Thus, if data output node 20a is a logic 0, the output of EXCLUSIVE OR gate 26a becomes a logic 1, indicating that the logic level of node 30a, which has a logic 1 level, is a valid logic input. It will be appreciated that node 30a is actually redundant in that the constraints of the external circuit dictate that a logic 1 can be output from EXCLUSIVE OR gate only when node 20a is a logic 0 and switch 36a is closed to hold node 22a at a logic 0, which is thus inverted to produce the logic 1 output at the EXCLUSIVE OR gate 26a.

Figure 4:
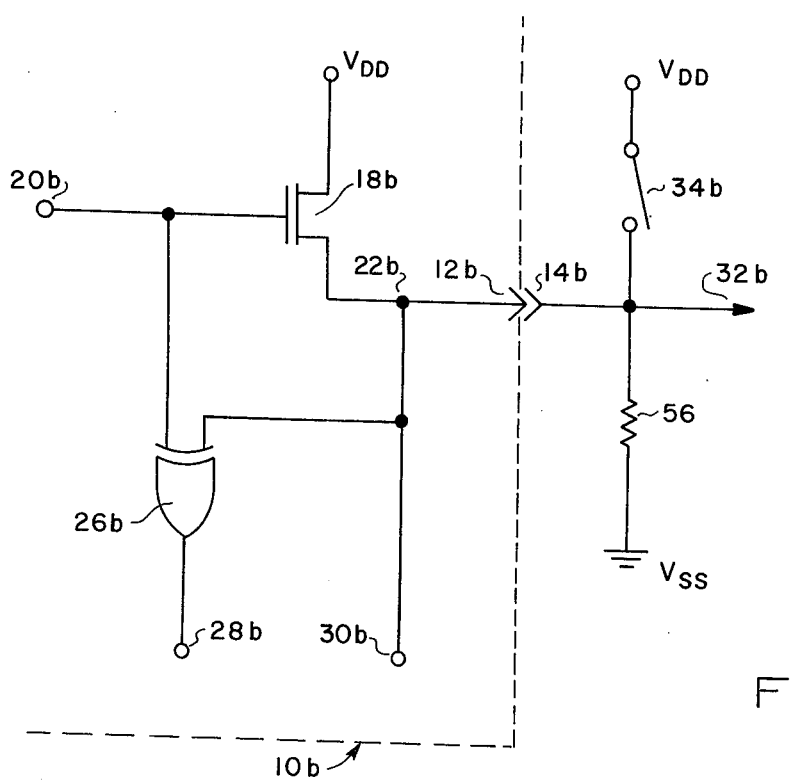
FIG. 4 is a simplified logic diagram illustrating still another aspect of the present invention.

The circuit illustrated in FIG. 4 is also very similar to the circuit illustrated in FIG. 1, and, accordingly, corresponding components and nodes are designated by the same reference numerals followed by the reference character b. In this case, buffer 18b is a non-inverting output buffer so that no compensating inverter is required. However, a switch 34b may connect the drain voltage supply $V_{DD}$ to nodes 22b and 32b, and a load resistor 56 connects these nodes to $V_{SS}$. Thus, when a logic 1 is applied to node 20b, transistor 18b is turned on so that nodes 22b and 32b are raised to a logic 1 level. The EXCLUSIVE OR gate can again be simplified for this special case if desired. Since nodes 20b and 22b are both at logic 1 levels, the output of EXCLUSIVE OR gate 26b is a logic 0. Similarly, when node 20b is a logic 0 level, transistor 18b is turned off and nodes 22b and 32b are pulled to ground by resistor 56. Again, the output of EXCLUSIVE OR gate 26b is a logic 0. However, when switch 34b is closed, nodes 22b and 32b are clamped to $V_{DD}$ and thus are at a logic 1 level. Then when node 20b goes to a logic 0 level, the EXCLUSIVE OR gate 26b will output a logic 1 level, indicating that the data applied to node 30b is a true logic 1. Again, the constraints of the external circuitry cause node 30b to be redundant since node 28b can go positive only when switch 34b is closed.

It will be appreciated that the EXCLUSIVE OR gate is one form of logic comparator and that other types of logic comparators can be used to produce the equivalent logic function, for the general or specific applications of the concept of the present invention.

It will also be appreciated that the circuit illustrated in FIG. 1 is a simplified logic diagram and that other combinations of true and complement logic elements can accomplish the same novel logic function. Although preferred embodiments of the invention have been described in detail, it is to be understood that various changes, substitutions and alterations can be made therein without departing from the spirit and scope of the invention as defined by the appended claims.

What is claimed is:

1. In integrated logic circuits, the combination of:
   a data pin for transferring data between the integrated logic circuit and an external logic circuit;
   an output buffer having a logic input and a logic output, the logic output being connected to the data pin;
   comparator logic means having one logic input logically coupled to the logic input of the output buffer and another logic input logically coupled to the logic output of the output buffer, and a logic output for producing an "input enable" signal when the logic inputs are different whereby the logic output of the output buffer can be driven by an external circuit to a logic level different from that applied to the logic input of the output buffer to produce an input enable signal at the output of the comparator logic means.

2. The combination of claim 1 further characterized by circuitry external to the integrated logic circuit for overriding the logic level applied to the pin by the output buffer for inputting data to the circuit.

3. In an integrated logic circuit, the method of outputting and inputting logic data through a single connector pin which comprises:
   outputting data by passing output logic data through an output buffer to the connector pin, while logically detecting that the logic input to the data buffer is the same as the logic output applied to the pin; and
   inputting data to the integrated circuit by overriding the logic level which would otherwise be produced on the pin by the output buffer in response to a logic input to the buffer while logically detecting within the integrated circuit that the logic input to the output buffer and the logic level on the pin are different to produce a logic signal internally of the intergrated circuit indicating that the data is being input.

* * * * *